United States Patent
Lai et al.

(10) Patent No.: US 9,054,025 B2
(45) Date of Patent: Jun. 9, 2015

(54) PROCESS FOR CONTROLLING SHALLOW TRENCH ISOLATION STEP HEIGHT

(75) Inventors: Su-Chen Lai, Hsinchu (TW); Kong-Beng Thei, Hsin-Chu County (TW); Harry Chuang, Hsin-Chu (TW); Gary Shen, Yonghe (TW); Shun-Jang Liao, Pingjhen (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/478,135

(22) Filed: Jun. 4, 2009

(65) Prior Publication Data

US 2010/0112732 A1 May 6, 2010

Related U.S. Application Data

(60) Provisional application No. 61/110,861, filed on Nov. 3, 2008.

(51) Int. Cl.
  *H01L 21/66* (2006.01)
  *H01L 21/762* (2006.01)

(52) U.S. Cl.
  CPC .......... *H01L 22/20* (2013.01); *H01L 21/76224* (2013.01); *H01L 22/12* (2013.01)

(58) Field of Classification Search
  None
  See application file for complete search history.

(56) References Cited

U.S. PATENT DOCUMENTS

| | | | |
|---|---|---|---|
| 6,391,729 B1 | 5/2002 | Hui | |
| 6,613,646 B1 | 9/2003 | Sahota et al. | |
| 7,094,653 B2 | 8/2006 | Chang et al. | |
| 7,279,381 B2 * | 10/2007 | Kwon | 438/248 |
| 7,365,012 B2 * | 4/2008 | Matsuo et al. | 438/689 |
| 2001/0034130 A1 | 10/2001 | Kusakabe et al. | |
| 2003/0100166 A1 * | 5/2003 | Pividori | 438/424 |
| 2004/0142640 A1 | 7/2004 | Prabhu et al. | |
| 2005/0085042 A1 * | 4/2005 | Chun et al. | 438/275 |
| 2006/0022299 A1 * | 2/2006 | Seo | 257/510 |
| 2007/0020878 A1 * | 1/2007 | Nam | 438/424 |
| 2007/0181916 A1 * | 8/2007 | Lee et al. | 257/257 |
| 2010/0062687 A1 * | 3/2010 | Oh et al. | 451/41 |
| 2010/0099260 A1 * | 4/2010 | Matsumoto et al. | 438/693 |

OTHER PUBLICATIONS

Chinese Patent Office, Office Action dated Jan. 26, 2011, Application No. 200910179129.2, 5 pages.

* cited by examiner

*Primary Examiner* — Fernando L Toledo
*Assistant Examiner* — Valerie N Newton
(74) *Attorney, Agent, or Firm* — Haynes and Boone, LLP

(57) ABSTRACT

A method for fabricating an integrated circuit with improved uniformity among the step heights of isolation regions is disclosed. The method comprises providing a substrate having one or more trenches; filling the one or more trenches; performing a chemical mechanical polishing on the one or more filled trenches, wherein each of the one or more filled trenches comprises a thickness; measuring the thickness of each of the one or more filled trenches; determining, based on the measured thickness of each of the one or more filled trenches, an amount of time to perform an etching process; and performing the etching process for the determined amount of time.

23 Claims, 8 Drawing Sheets

PROCESS FOR CONTROLLING SHALLOW TRENCH ISOLATION STEP HEIGHT

PRIORITY DATA

This application claims priority to Provisional Application Ser. No. 61/110,861 filed on Nov. 3, 2008, entitled "A NOVEL PROCESS FOR CONTROLLING SHALLOW TRENCH ISOLATION STEP HEIGHT", the entire disclosure of which is incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down has also required that the various processes utilized to fabricate the IC features produce IC features with minimal dimensional and geometrical variations. For example, conventional processing produces isolation regions with varying step heights. These varying step heights contribute to poor device performance and poor critical dimension uniformity.

Accordingly, what is needed is a method for making a semiconductor device that addresses the above stated issues.

SUMMARY

A method for fabricating an integrated circuit device is provided. In one embodiment, the method includes providing a substrate having one or more trenches; filling the one or more trenches; and performing a chemical mechanical polishing on the one or more filled trenches, wherein each of the one or more filled trenches comprises a thickness. The thickness of each of the one or more filled trenches may be measured, and based on the measured thickness of each of the one or more filled trenches, an amount of time to perform an etching process is determined. An etching process may be performed for the determined amount of time.

In one embodiment, a method for fabricating an integrated circuit comprises providing a substrate; forming at least one layer over the substrate; forming at least one isolation region on the substrate; and under polishing the at least one isolation region. A thickness of the at least one isolation region may be measured, and then, a wet etching process may be performed for a duration determined by evaluating the measured thickness of the at least one isolation region.

In another embodiment, a method for fabricating a semiconductor device comprises performing a chemical mechanical polishing, wherein the chemical mechanical polishing forms at least one isolation region with a first thickness; measuring the first thickness of the at least one isolation region; and performing a wet etching process for a duration determined by the measured first thickness. The wet etching process may leave the at least one isolation region with a second thickness.

In yet another embodiment, a method for controlling step height of one or more isolation regions on a semiconductor device is provided. The method comprises performing a chemical mechanical polishing (CMP), wherein the CMP under polishes the one or more isolation regions; measuring the step height of the one or more isolation regions; and performing a wet etching process if the measured step height of the one or more isolation regions does not meet a target step height.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for only illustration purposes. In fact, the dimensions of the various features may be arbitrarily increased or reduced for clarity of discussion.

DETAILED DESCRIPTION

Figure 1:
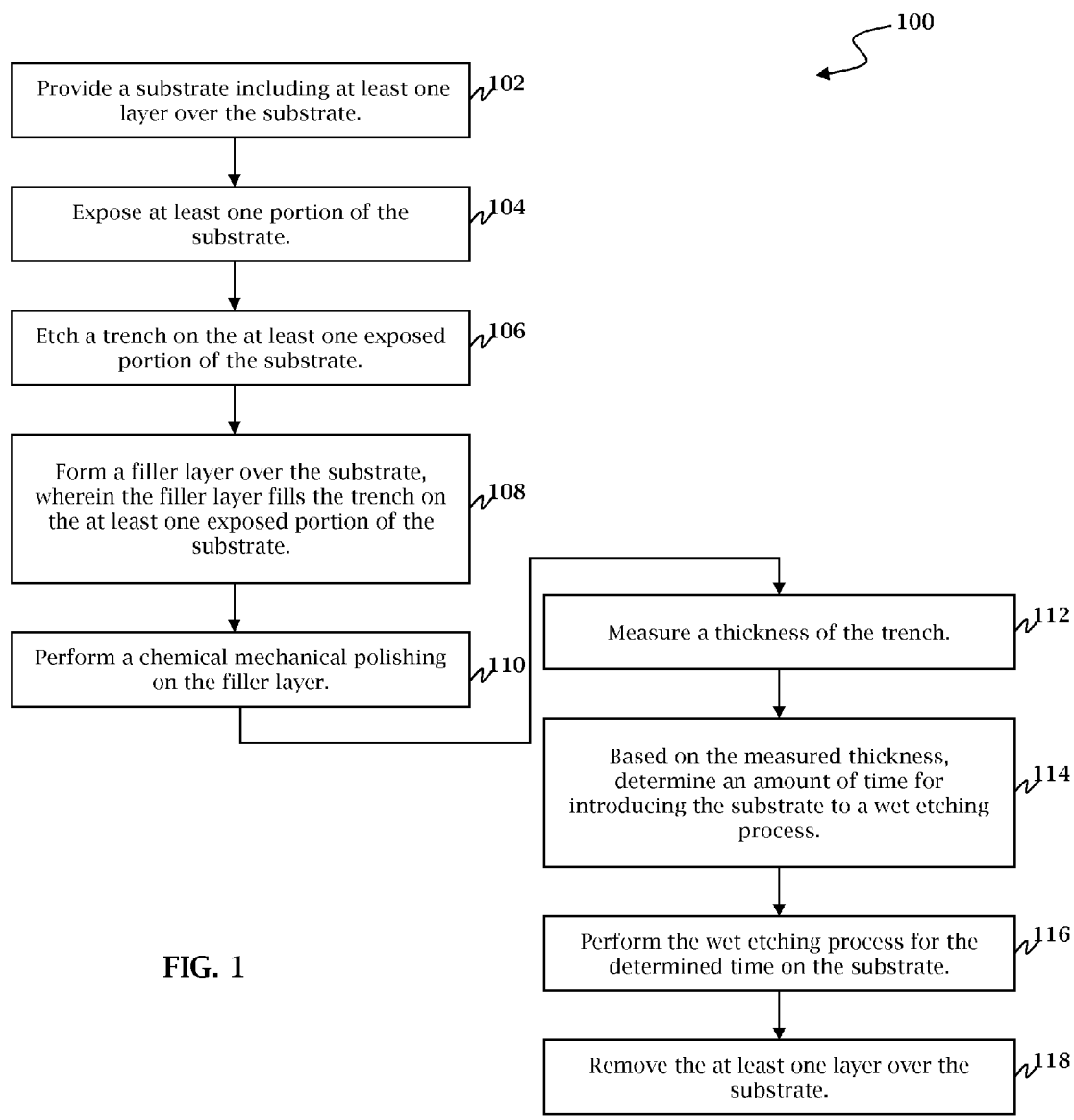
FIG. 1 is a flow chart of a method for fabricating a semiconductor device according to aspects of the present invention.

The present disclosure relates generally to methods for manufacturing semiconductor devices, and more particularly, to a method for manufacturing a semiconductor device that improves control of isolation region step height.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

With reference to FIGS. 1 through 11C, a method 100 and a semiconductor device 200 are collectively described below. FIG. 1 is a flow chart of one embodiment of the method 100 for making the semiconductor device 200. FIGS. 2-11C are various cross-sectional views of the semiconductor device 200 according to one embodiment, in portion or entirety, during various fabrication stages of the method 100. It is understood that additional steps can be provided before, during, and after the method 100, and some of the steps described below can be replaced or eliminated, for additional embodiments of the method. It is further understood that additional features can be added in the semiconductor device 200, and some of the features described below can be replaced or eliminated, for additional embodiments of the semiconductor device 200. The present embodiment of method 100 and semiconductor device 200 provides step height uniformity.

Figure 2:
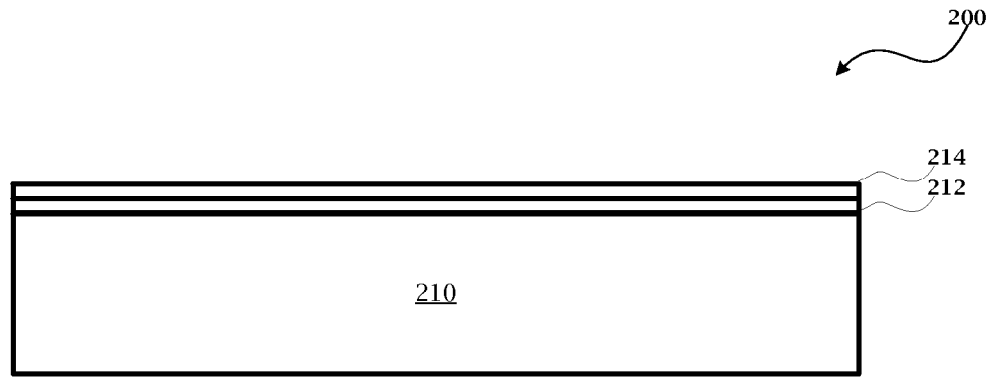
FIGS. 2-11C are various cross-sectional views of embodiments of a semiconductor device during various fabrication stages according to the method of FIG. 1.

Referring to FIGS. 1 and 2, the method 100 begins at step 102 wherein a substrate 210 is provided. In the present embodiment, the substrate 210 is a semiconductor substrate (or semiconductor wafer). The semiconductor substrate 210 may comprise an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; and/or combinations thereof. In one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the semiconductor substrate may be a semiconductor on insulator (SOI) or a thin film transistor (TFT). In some examples, the semiconductor substrate may include a doped epi layer or a buried layer. In other examples, the compound semiconductor substrate may have a multilayer structure, or the silicon substrate may include a multilayer compound semiconductor structure. The substrate 210 may alternatively be a non-semiconductor material such as a glass substrate.

At least one layer may be disposed over the substrate 210. In the present embodiment, the at least one layer comprises a first layer 212 and a second layer 214, which are formed over the semiconductor substrate 210 by any suitable process. For example, the first and second layers 212, 214 may be formed by a deposition process, such as chemical vapor deposition (CVD), physical vapor deposition (PVD), atomic layer deposition (ALD), sputtering, plating, other suitable methods, and/or combinations thereof. In one example, forming the first layer 212 may comprise growing a pad oxide over the semiconductor substrate 210. Further, the layers 212, 214 may comprise any suitable composition and/or thickness. The second layer 214 may comprise a nitrogen-containing material, such as silicon nitride and/or silicon oxynitride; an amorphous carbon material; silicon carbide; other suitable materials; and/or combinations thereof. In the present embodiment, the second layer 214 comprises a silicon nitride layer. In one example, the second layer 214 may comprise a low pressure CVD nitride layer. It is understood that the layers 212, 214 may include a single layer or multiple layers. It is further understood that, in some embodiments, the first layer 212 or second layer 214 may be omitted entirely from semiconductor device 200.

Figure 3:
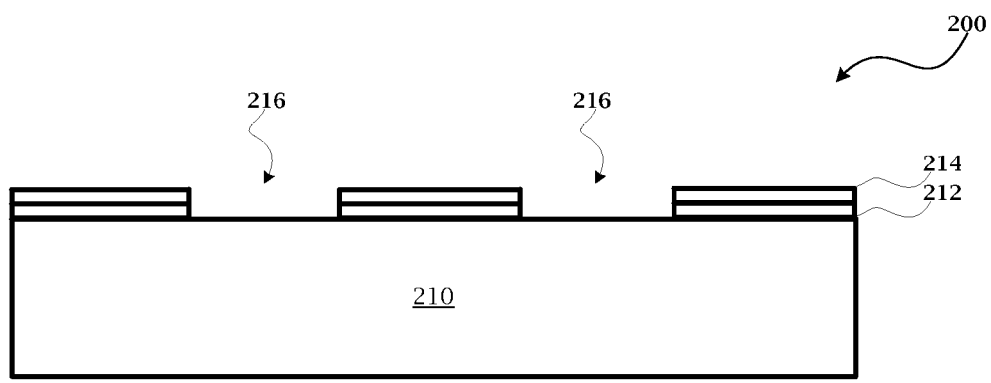

The method proceeds to step 104 by exposing at least one portion of the semiconductor substrate 210. The substrate 210 may be exposed by creating openings and removing portions of the at least one layer over the substrate 210. In the present embodiment, portions of the first and second layers 212, 214 are removed, resulting in exposed portions 216 of the semiconductor substrate 210 as illustrated in FIG. 3. The first and second layers 212, 214 may be removed by any suitable process. For example, removing the first and second layers 212, 214 may comprise a conventional photolithography patterning process. The photolithography patterning process may include photoresist coating (e.g., spin-on coating), soft baking, mask aligning, exposure, post-exposure baking, developing the photoresist, rinsing, drying (e.g., hard baking), other suitable processes, and/or combinations thereof. The photolithography exposing process may also be implemented or replaced by other proper methods such as maskless photolithography, electron-beam writing, ion-beam writing, and molecular imprint.

Referring to FIGS. 1, 4-6, and 7A-7C, the method 100 proceeds by forming at least one isolation region 218 including liner layer 220 and filler layer 222 on the exposed portions 216 of the semiconductor substrate 210. In the present embodiment, a plurality of isolation regions 218 are formed on the semiconductor substrate 210. The isolation regions 218 may utilize isolation technology, such as local oxidation of silicon (LOCOS) or shallow trench isolation (STI), to define and electrically isolate various regions of the semiconductor substrate 210. In the present embodiment, the isolation regions 218 include STIs.

Figure 4:
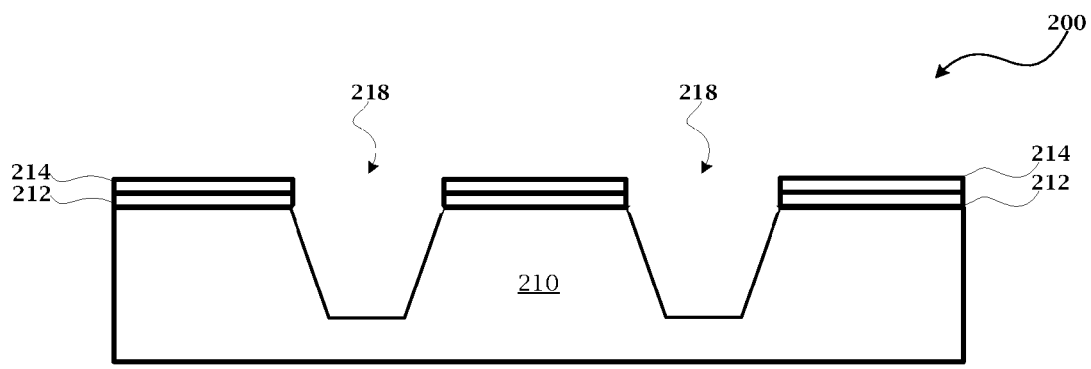
Figure 5:
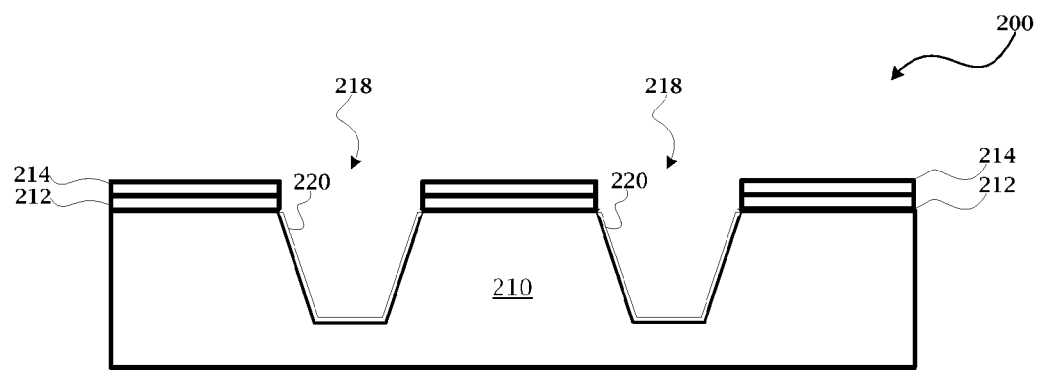

The isolation regions 218, and in the present embodiment, the STIs, may be formed by any suitable process. In the present embodiment, at step 106, the formation of the isolation regions 218 includes etching a trench (or recess) on the exposed portions 216 of the semiconductor substrate 210 as shown in FIG. 4. The etching process may include dry etching, wet etching, and/or other etching methods (e.g., reactive ion etching). The etching process may also be either purely chemical (plasma etching), purely physical (ion milling), and/or combinations thereof. Optionally, as illustrated in FIG. 5, the liner layer 220 may be formed over the isolation regions 218 by any suitable process. For example, forming the liner layer 220 may comprise growing a thermal oxide trench liner to improve the trench interface. It is understood that the liner layer 220 may be omitted entirely from semiconductor device 200.

Figure 6:
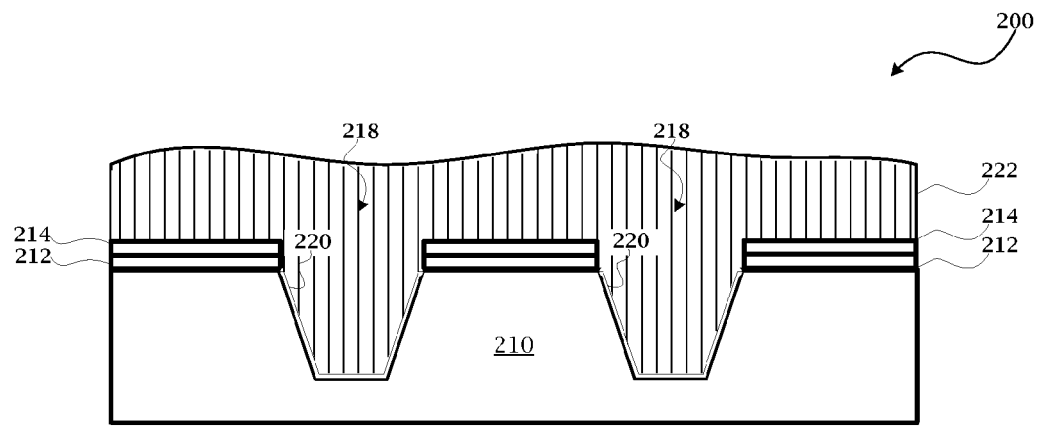

Referring to FIGS. 1 and 6, at step 108, forming the isolation regions 218 further includes filling the trench (or recess). A filler layer 222 is deposited over the semiconductor substrate 210. The filler layer 222 deposited over the semiconductor substrate 210 fills the trench of the isolation regions 218. The filler layer 222 comprises a dielectric material, such as silicon oxide, silicon nitride, silicon oxynitride, fluoride-doped silicate glass (FSG), a low-K dielectric material, other suitable materials, and/or combinations thereof. Further, the filler layer 222 may be formed by any suitable deposition process, such as CVD, PVD, ALD, sputtering, plating, high density plasma (HDP) processes, high aspect ratio deposition processes (HARP), other suitable methods, and/or combinations thereof. In some embodiments, the trenches are filled with a CVD oxide.

Figure 7A:
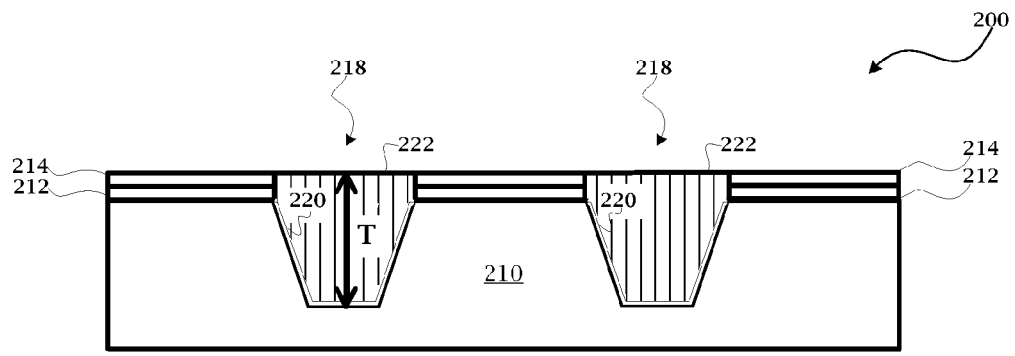
Figure 7B:
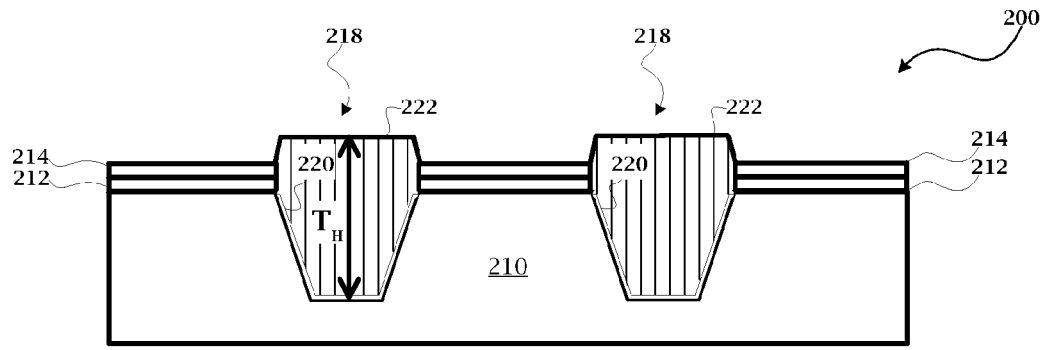
Figure 7C:
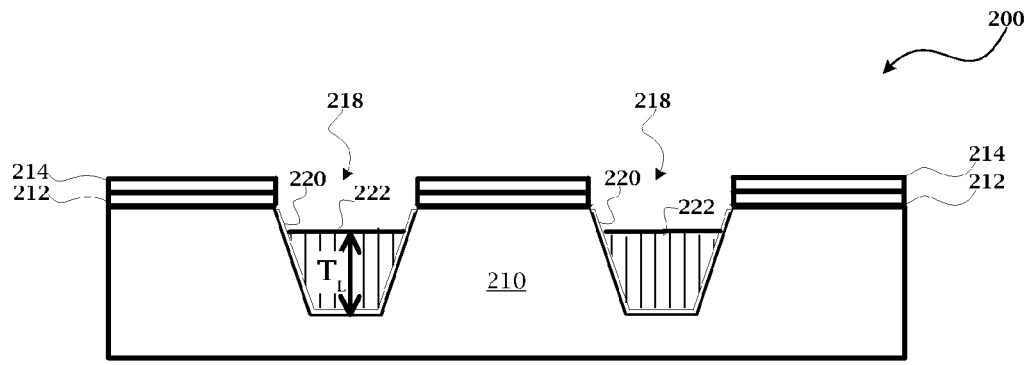

Thereafter, referring to FIGS. 1 and 7A, at step 110, a chemical mechanical polishing (CMP) process is performed on the filler layer 222 to etch back and planarize the filler layer 222 until the second layer 214 (i.e., in the present embodiment, the silicon nitride layer) is reached and exposed. The CMP process may selectively stop at the second layer 214, completing the formation of the isolation regions 218 comprising the liner layer 220 and filler layer 222, leaving the isolation regions 218 with a step height or thickness, T, as illustrated in FIG. 7A. In the present embodiment, the thickness, T, represents a target step height for the isolation regions 218. Typically, the target thickness, T, is controlled and achieved by the CMP process; however, it has been observed that the CMP process alone results in the isolation regions 218 on the semiconductor device 200 having varying step-heights or thicknesses that stray from the target thickness. For example, the CMP process may result in the isolation regions 218 having a larger than desirable thickness, $T_H$, as illustrated in FIG. 7B (i.e., a top surface of the isolation regions 218 is undesirably higher than a top surface of the semiconductor substrate 210); or the CMP process may result in the isolation regions 218 having a lower than desirable thickness, $T_L$, as illustrated in FIG. 7C (i.e., a top surface of the isolation regions 218 is undesirably lower than a top surface of the semiconductor substrate 210). Essentially, the semiconductor device 200 may comprise isolation regions 218 having the target thickness T illustrated in FIG. 7A, the higher than desirable thickness $T_H$ illustrated in FIG. 7B (resulting from under-polishing), and the lower than desirable thickness $T_L$ as illustrated in FIG. 7C (resulting from over-polishing). The varied thicknesses (or step-heights) of the isolation regions 218 adversely affects subsequent processing and overall device performance as discussed in more detail below.

Figure 8A:
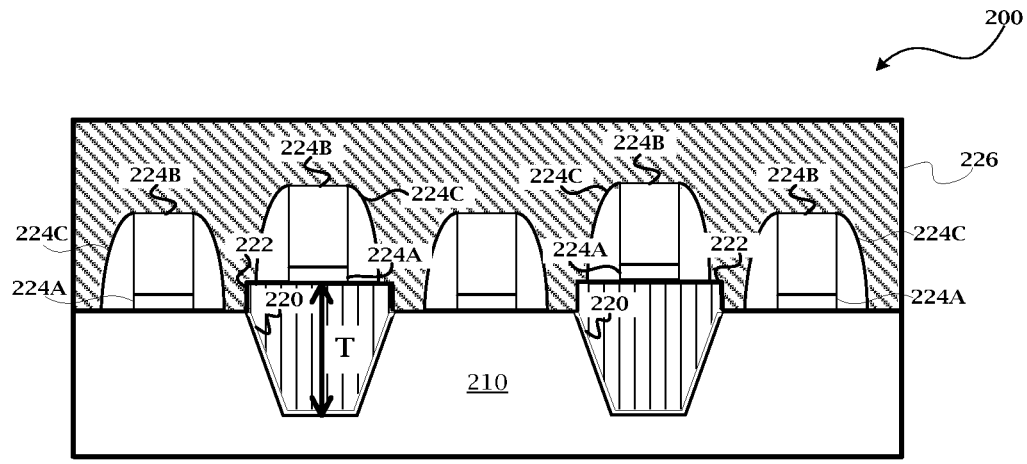
Figure 8B:
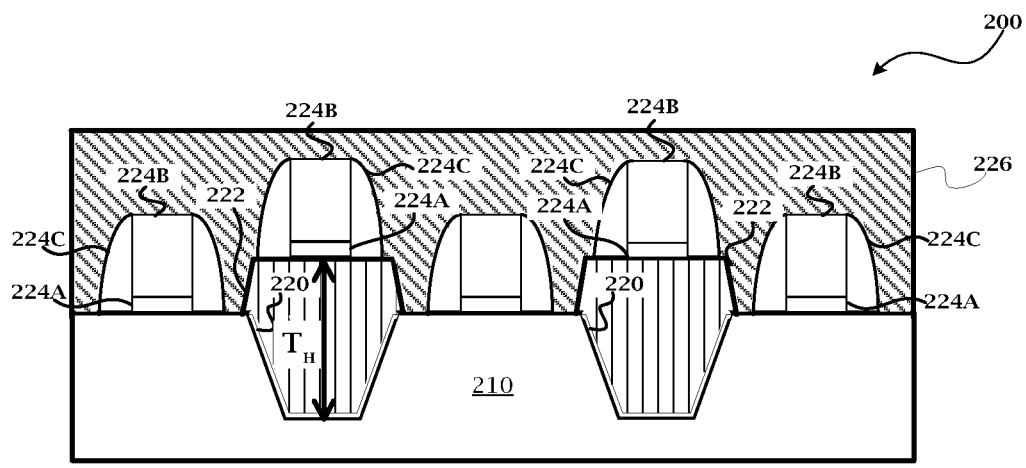
Figure 8C:
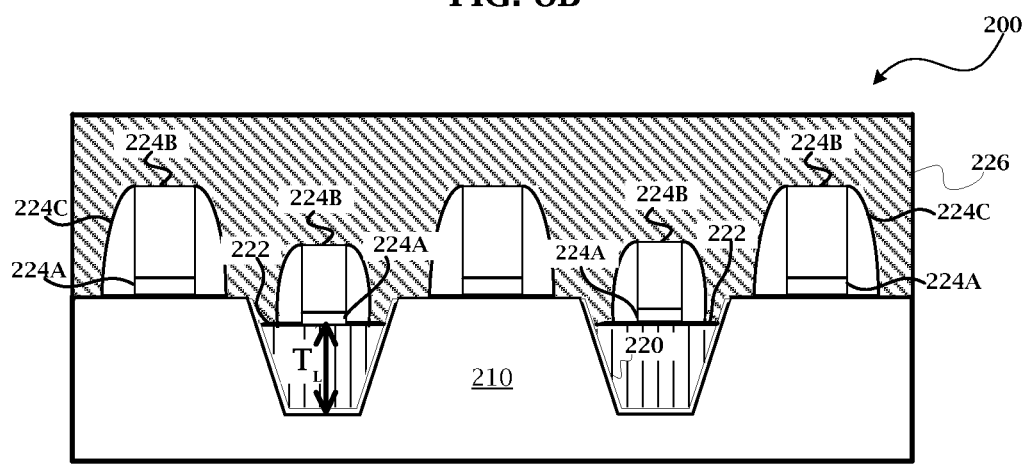

Typically, referring to FIGS. 8A, 8B, and 8C, despite whether the isolation regions 218 comprise the target thickness (i.e., the isolation regions 218 comprise thicknesses T, $T_H$, and $T_L$), conventional processing follows by removing the first and second layers 212, 214; forming at least one gate structure over the semiconductor substrate 210 and the at least one isolation region 218, the at least one gate structure including dielectric layer 224A, gate layer 224B, and gate spacers 224C; and depositing an etch stop layer 226 over the semiconductor device 200.

Removing the first and second layers 212, 214 may comprise any suitable process. For example, the first and second layers 212, 214 may be removed using a nitride stripping process to remove the silicon nitride layer. Further, it is understood that the at least one gate structures including dielectric layers 224A and gate layers 224B may be formed over the semiconductor substrate 210 and isolation regions 218 by any suitable process. For example, the at least one gate structures may be formed by conventional deposition, photolithography patterning, and etching processes, and/or combinations thereof. The deposition processes may include CVD, PVD, ALD, sputtering, plating, other suitable methods, and/or combinations thereof. The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The photolithography exposing process may also be implemented or replaced by other proper methods such as maskless photolithography, electron-beam writing, ion-beam writing, and molecular imprint. The etching processes may include dry etching, wet etching, and/or other etching methods (e.g., reactive ion etching). The etching process may also be either purely chemical (plasma etching), purely physical (ion milling), and/or combinations thereof. It is understood that the at least one gate structures may be formed simultaneously, utilizing the same processing steps and processing materials; independently of one another, utilizing varying processing steps and processing materials; or using a combination of simultaneous and independent processing steps and processing materials.

The dielectric layers 224A are disposed on the semiconductor substrate 210 and the isolation regions 218. The dielectric layers 224A may comprise a high-k dielectric material, which may be selected from metal oxides, metal nitrides, metal silicates, transition metal-oxides, transition metal-nitrides, transition metal-silicates, oxynitrides of metals, metal aluminates, zirconium silicate, zirconium aluminate, $HfO_2$, HfSiO, HfSiON, HfTaO, HfTaTiO, HfTiO, HfZrO, HfAlON, and/or combinations thereof. Examples of the dielectric material further include silicon oxide, silicon nitride, silicon oxynitride, hafnium oxide, zirconium oxide, titanium oxide, aluminum oxide, hafnium dioxide-alumina ($HfO_2$—$Al_2O_3$) alloy, other suitable dielectric materials, and/or combinations thereof. The dielectric layers 224A may further include a multilayer structure comprising multiple dielectric materials. In some embodiments, the dielectric layers 224A may comprise a layer of silicon dioxide and a layer of high-k dielectric material. Further, the dielectric layers 224A may be doped polycrystalline silicon with the same or different doping.

The gate layers 224B of the at least one gate structure are disposed over the dielectric layers 224A. The gate layers 224B may comprise polycrystalline silicon; silicon-containing materials, such as silicon nitride, silicon oxide, silicon carbide, silicon oxynitride; germanium-containing materials; metal, such as aluminum, copper, tungsten, titanium, tantulum, titanium nitride, tantalum nitride, nickel silicide, cobalt silicide; other suitable materials; and/or combinations thereof. The gate layers 224B may further include a multilayer structure. Further, the gate layers 224B may be doped polycrystalline silicon with the same or different doping.

The at least one gate structures may further include gate spacer liners and gate spacers 224C. The gate spacer liners may comprise any suitable material, such as a spacer oxide. The gate spacers 224C, which may be positioned on each side of the at least one gate structures, may comprise a dielectric material such as silicon nitride, silicon oxide, silicon carbide, silicon oxynitride, other suitable materials, or combinations thereof. In some embodiments, the gate spacer liners and/or the gate spacers may comprise a multilayer structure. It is understood that the at least one gate structures may comprise additional layers. For example, the at least one gate structures may comprise hard mask layers, interfacial layers, capping layers, diffusion/barrier layers, dielectric layers, metal layers, other suitable layers, and/or combinations thereof. Also, the semiconductor device 200 may include antireflective coating layers or bottom antireflective coating layers. Further, it is understood that various features and structures (e.g., source/drain regions, lightly doped source/drain (LDD) regions, silicide regions, etc.) may also be formed as is known in the art.

Figure 9:
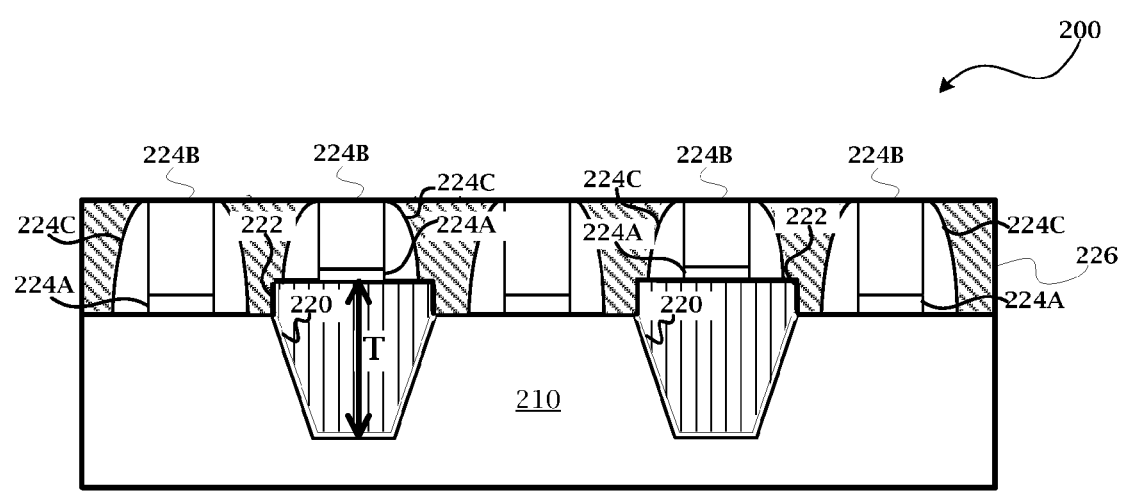

An etch stop layer (ESL) and interlayer dielectric (ILD) 226 may be formed over the semiconductor device 200, including over the at least one gate structures, by any suitable process. The ESL may include silicon nitride, silicon oxynitride, and/or other suitable materials. The ESL composition may be selected based upon etching selectivity to one or more additional features of the semiconductor device 200. In the present embodiment, the ESL is a contact etch stop layer (CESL). The ILD 226 may include silicon oxide or a low k material. In an embodiment, the ILD 226 includes a high density plasma (HDP) oxide. Alternatively, the ILD may optionally include a spin-on-glass (SOG) or high aspect ration process (HARP) oxide. When the thickness (or step height) of the isolation regions 218 comprises the target thickness, T, after deposition, the ILD 226 is planarized by a CMP process until a top portion of the at least one gate structures overlying the semiconductor substrate 210 and the isolation regions 218 are exposed as illustrated in FIG. 9. The CMP process may have a high selectivity to provide a substantially planar surface for the at least one gate structures and the ILD. The CMP process may also have low dishing and/or metal erosion effect.

As noted above, problems arise when the thickness or step height of the isolation regions 218 varies from the target thickness T and comprises a higher than desirable thickness $T_H$ or a lower than desirable thickness $T_L$. For example, semiconductor devices having isolation regions 218 with varied step heights exhibit poor critical dimension uniformity (CDU), particularly the poly after etching inspection CDU within the semiconductor device (or wafer) and within the isolation regions/semiconductor device active region bias. Further, when the isolation regions 218 comprise a step height of $T_H$ or $T_L$, the CMP process window for etching back ILD 226 narrows significantly. Accordingly, issues arise if the CMP process over-polishes or under-polishes.

Figure 10A:
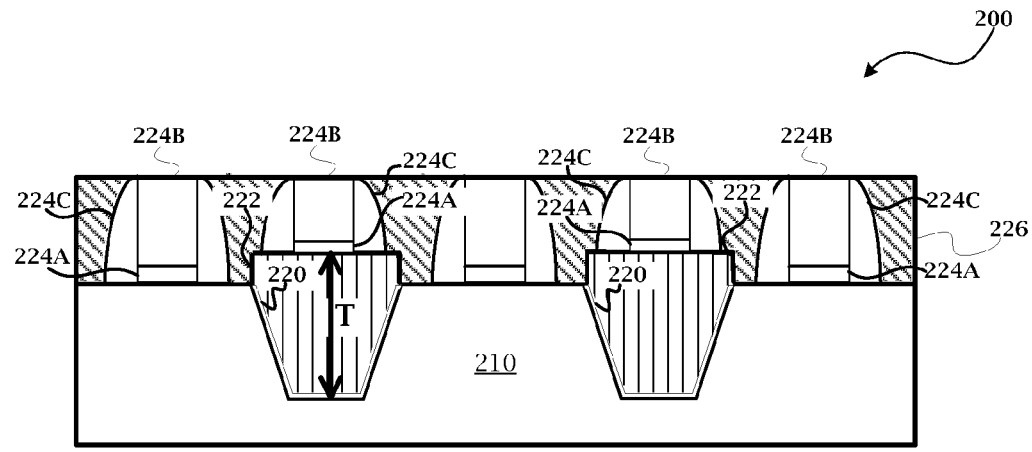
Figure 10B:
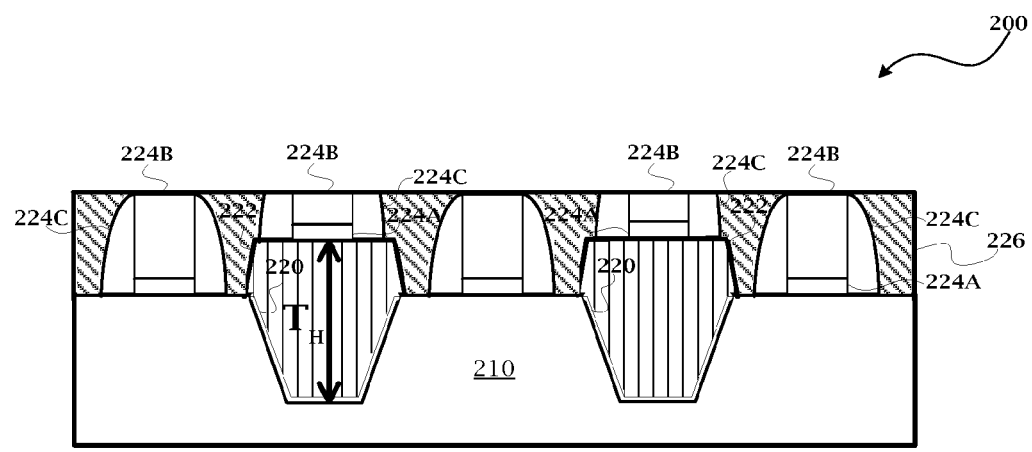
Figure 10C:
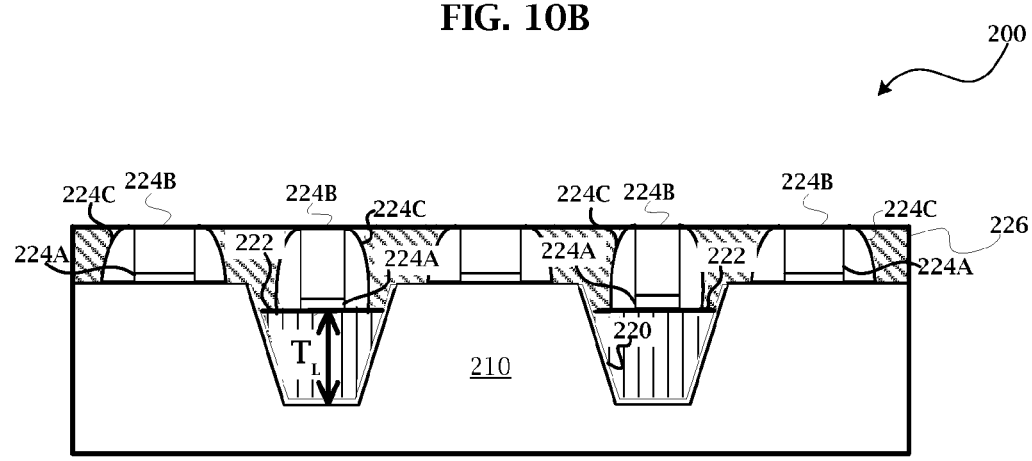

FIGS. 10A, 10B, and 10C illustrate the effects of a CMP process over-polishing the ILD 226 with the varied step heights of the isolation regions 218. More particularly, over-polishing ILD 226 results in gate height issues when the isolation regions 218 comprise $T_H$ or $T_L$. For example, in FIG. 10B, when the isolation regions 218 comprise $T_H$, the height of the gate structures over the isolation regions 218 is reduced significantly. In FIG. 10C, when the isolation regions 218 comprise $T_L$, the height of the gate structures over the semiconductor substrate 210 is reduced significantly. Referring to FIG. 10A, note that, when the isolation regions 218 comprise the target thickness T, the semiconductor structure 200 is not affected by over-polishing, and the CMP process to etch back ILD 226 adequately exposes the at least one gate structures over the semiconductor substrate 210 and the isolation regions 218.

Figure 11A:
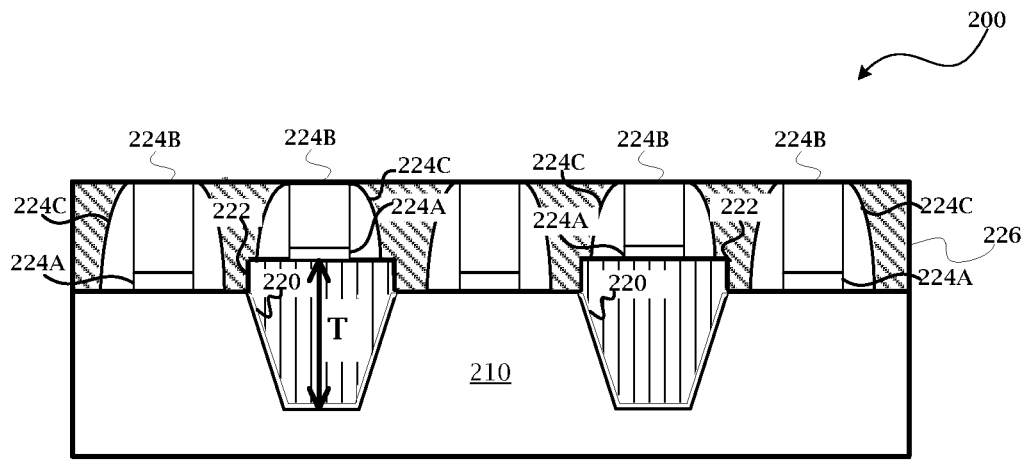
Figure 11B:
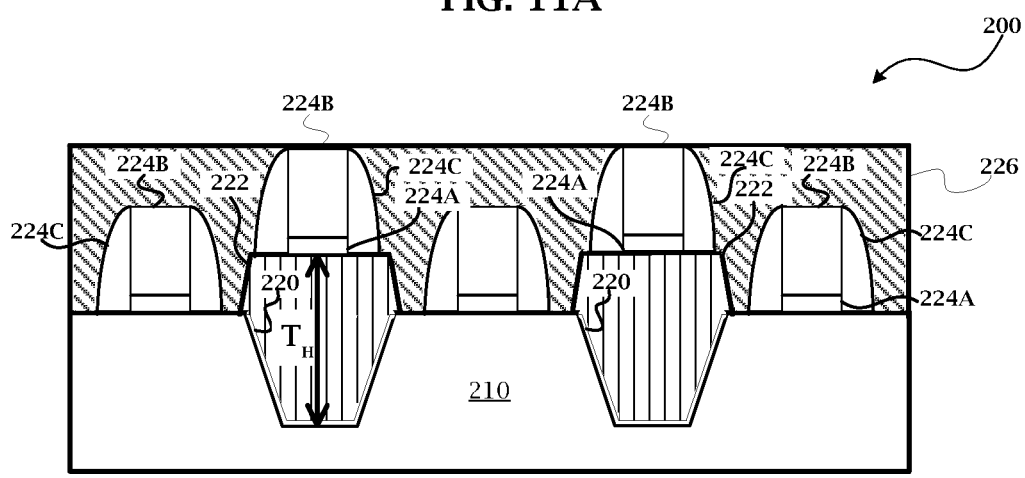
Figure 11C:
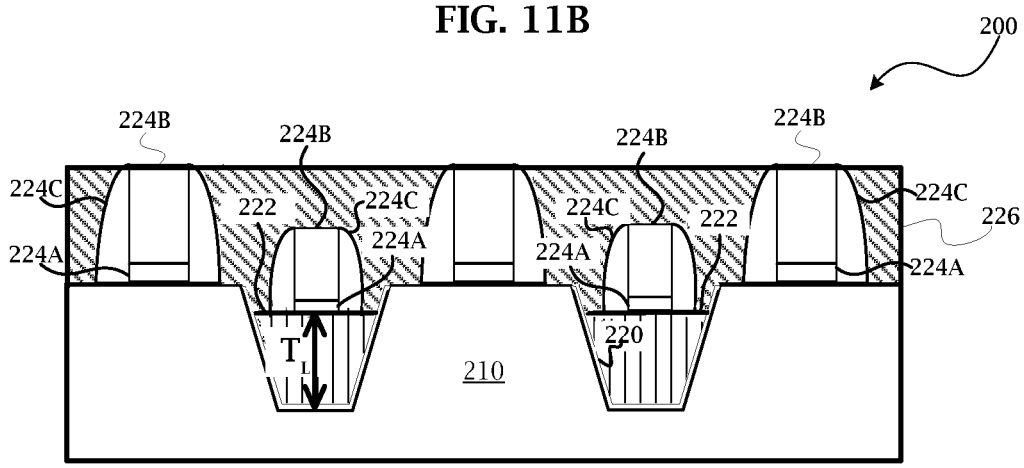

FIGS. 11A, 11B, and 11C illustrate the effects of a CMP process under-polishing the ILD 226 with the varied step heights of the isolation regions 218. More particularly, under-polishing ILD 226 results in gate removal issues when the isolation regions 218 comprise $T_H$ or $T_L$. For example, in FIG. 11B, where the isolation regions 218 comprise $T_H$, ILD layer 226 remains over the gate structures over the semiconductor substrate 210. In FIG. 11C, where the isolation regions 218 comprise $T_L$, ILD layer 226 remains over the gate structures over the isolation regions 218. This presents difficulty in later processing because the ILD layer 226 remaining over the gate structures prevents the dielectric layers 224A and gate layers 224B from being removed. Again, referring to FIG. 11A, note that, when the isolation regions 218 comprise the target thickness T, the semiconductor structure 200 is not affected by the under-polishing, and the CMP process to etch back ILD 226 adequately exposes the at least one gate structures over the semiconductor substrate 210 and the isolation regions 218.

Accordingly, it is desirable to more accurately control the step height (or thickness) of the isolation regions 218 on the semiconductor structure 200, ensuring that the thicknesses are as uniform as possible over the semiconductor device 200. Ideally, the thickness of each isolation region 218 on semiconductor device 200 comprises the target thickness T. The present invention introduces a wet etching process to better control and adjust the thickness/step height of the isolation regions 218. Referring to FIG. 1, at step 110, the CMP process is applied to the filler layer 222 to form the isolation regions 218 including the liner layer 220 and the filler layer 222. In the present embodiment, the CMP process under polishes the filler layer 222. Then, at step 112, the thicknesses (or step heights) of the isolation regions 218 are measured. The thicknesses (or step heights) may be measured by any suitable method. For example, in the present embodiment, an average thickness for the isolation regions 218 may be calculated. In some embodiments, average thicknesses at various locations of the semiconductor device 200 (or wafer) are calculated.

At step 114, an amount of time for applying the wet etching process is determined. The amount of time for applying the wet etching process may be any suitable time and may be determined by any suitable method. For example, if the measured thickness is between A and B, the wet etching process may be applied for 20 seconds; if the measured thickness is between B and C, the wet etching process may be applied for 40 seconds; if the measured thickness is between C and D, the wet etching process may be applied for 60 seconds; etc. In some embodiments, the measured thickness may be compared to the target thickness T to determine a variance, the difference between the measured thickness and the target thickness T; and based on the determined variance, the amount of time for applying the wet etching process on the semiconductor structure 200 may be determined.

The method proceeds to step 116 by applying the wet etching process to the semiconductor substrate 210 for the determined time. Any suitable wet etching process may be applied to the semiconductor substrate 210. In the present embodiment, the wet etching process utilizes hydrofluoric acid (HF) for a HF dipping process. The HF solution may have any suitable concentration. In some embodiments, the wet etching process may apply a diluted hydrofluoric acid (HF) to the semiconductor structure 200. The wet etching process (in the present embodiment, the HF dipping process) applied after the CMP process at step 110 effectively controls the thickness (or step-height) variations among the isolation regions 218 on semiconductor substrate 210. In some embodiments, after the wet etching process, the thicknesses (or step heights) of the isolation regions 218 may be measured again. If the re-measured thicknesses meet the target thickness, then processing may continue. If the re-measured thicknesses do not meet the target thickness, then steps 114, 116 may be repeated.

Subsequently, at step 118, referring again to FIGS. 7A and 8A, conventional processing continues by removing the at least one layer (e.g., the first and second layers 212, 214) over the substrate 210 as discussed above. The conventional processing may continue to arrive at the semiconductor device 200 illustrated in FIG. 9. The combination of the CMP process, particularly the CMP under-polish, and the wet etching process on the isolation regions provides fine-tuning control of the isolation regions' thickness (or step height), allowing better uniformity of the step heights of the isolation regions on the semiconductor substrate 210 (or wafer). Achieving uniformity of the target thickness increases process windows, maintaining the integrity of the semiconductor device 200 during subsequent processing, such as the CMP process on the ILD 226, despite whether the ILD 226 may be over-polished or under-polished as shown in FIGS. 10A and 11A.

Overall, the disclosed embodiments provide one or more of the following advantages: (1) improves overall device performance; (2) provides improved critical dimension uniformity; (3) improves control over process variation, particularly over step height variations; and (4) integrates easily into conventional processing methods. It is understood that the method described above may be implemented as an automated process control in a semiconductor manufacturing environment (e.g., step height control by an auto feed-forward function). Implementing the method as an automated process control provides good control of process variation and good process integration performance. It is further understood that the semiconductor device 200 may undergo further processing to form various features known in the art. In still another example, various contacts/vias and multilayer interconnect features (e.g., metal layers and interlayer dielectrics) may be formed over the substrate 210 and configured to connect the various features or structures of the semiconductor device 200.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating an integrated circuit, the method comprising:
    providing a substrate having one or more trenches, wherein a nitrogen-containing layer is disposed over the substrate between each of the one or more trenches;
    filling the one or more trenches;
    performing a chemical mechanical polishing on the one or more filled trenches to form one or more device isolation regions, wherein the chemical mechanical polishing includes under polishing the one or more filled trenches, and wherein each of the one or more device isolation regions comprises a thickness;
    measuring the thickness of each of the one or more device isolation regions;
    determining, based on the measured thickness of each of the one or more device isolation regions an amount of time to perform a wet etching process to reduce the measured thickness to a target thickness, such that, when at the target thickness, each of the one or more device isolation regions has a top surface that is level with a top surface of other device isolation regions and the top surface of each of the one or more device isolation regions is level with the nitrogen-containing layer;
    performing the wet etching process for the determined amount of time and re-measuring the thickness of each of the one or more device isolation regions; and
    determining whether the re-measured thickness of each of the one or more device isolation regions meets the target thickness, wherein if the re-measured thickness of each of the one or more device isolation regions meets the target thickness, removing the nitrogen-containing layer, and wherein if the re-measured thickness of each of the one or more device isolation regions does not meet the target thickness, performing an additional wet etching process for an additional amount of time prior to removing the nitrogen-containing layer.

2. The method of claim 1 wherein the wet etching process and the additional wet etching process include a hydrofluoric acid dipping process.

3. The method of claim 1 wherein the determining, based on the measured thickness of each of the one or more device isolation regions, the amount of time to perform the wet etching process comprises determining an average thickness of the one or more device isolation regions.

4. The method of claim 1 wherein the determining, based on the measured thickness of each of the one or more device isolation regions, the amount of time to perform the wet etching process comprises comparing the measured thickness of each of the one or more device isolation regions with the target thickness.

5. The method of claim 1, wherein the one or more device isolation regions comprise shallow trench isolation regions.

6. The method of claim 1 further comprising determining, based on the re-measured thickness of each of the one or more device isolation regions, the additional amount of time to perform the additional wet etching process including determining an average thickness of the one or more device isolation regions.

7. The method of claim 1 further comprising determining, based on the re-measured thickness of each of the one or more device isolation regions, the additional amount of time to perform the additional wet etching process including comparing the re-measured thickness of each of the one or more device isolation regions with the target thickness.

8. A method for fabricating an integrated circuit, the method comprising:
    providing a substrate;
    forming a nitrogen-containing layer over the substrate;
    creating an opening in the nitrogen-containing layer over the substrate, wherein the opening exposes a portion of the substrate;
    etching a trench in the exposed portion of the substrate;
    filling the trench with a dielectric material;
    under polishing the dielectric material to form a device isolation region;
    performing a first of a plurality of wet etching processes to reduce a thickness of the dielectric material to a target thickness and for a duration determined by evaluating a measured thickness of the under-polished dielectric material
    re-measuring the thickness of the dielectric material; and
    determining whether the re-measured thickness of the dielectric material meets the target thickness, wherein if the re-measured thickness of the dielectric material meets the target thickness, removing the nitrogen-containing layer, and wherein if the re-measured thickness of the dielectric material does not meet the target thickness, performing a second of the plurality of wet etching processes for a duration determined by evaluating the re-measured thickness of the dielectric material prior to removing the nitrogen-containing layer.

9. The method of claim 8 wherein under polishing the dielectric material comprises performing a chemical mechanical polishing process on the dielectric material.

10. The method of claim 8, wherein the device isolation region comprises a shallow trench isolation region.

11. The method of claim 8 further comprising performing the plurality of wet etching processes such that the device isolation region has a top surface that is level with a top surface of other device isolation regions and the top surface of each of the one or more device isolation regions is level with the nitrogen-containing layer.

12. A method for fabricating a semiconductor device comprising:
    performing a chemical mechanical polishing, wherein the chemical mechanical polishing results in a device isolation region having a first thickness, and wherein the chemical mechanical polishing includes under polishing the device isolation region;
    measuring the first thickness of the device isolation region;
    performing a first wet etching process for a duration determined by the measured first thickness, wherein the first wet etching process results in the device isolation region having a second thickness less than the first thickness;
    measuring the second thickness of the device isolation region;
    performing a second wet etching process for a duration determined by the measured second thickness, wherein the second wet etching process results in the device isolation region having a target thickness, wherein the target thickness is the intended thickness of the device isolation region.

13. The method of claim 12 wherein performing each of the first and second wet etching processes includes performing a hydrofluoric acid dipping process.

14. The method of claim 12 wherein performing the first wet etching process for a duration determined by the measured first thickness includes comparing the measured first thickness with the target thickness.

15. The method of claim 12, wherein the device isolation region comprises a single layer.

16. The method of claim 12, wherein the device isolation region comprises a shallow trench isolation region.

17. The method of claim 12 further comprising:
providing a substrate having one or more trenches, wherein a nitrogen-containing layer is disposed over the substrate between each of the one or more trenches;
filling the one or more trenches;
performing the chemical mechanical polishing on the one or more filled trenches; and
performing the first and second wet etching process until a top surface of the device isolation region is level with a top surface of other device isolation regions and the top surface of the device isolation regions is level with the nitrogen-containing layer.

18. The method of claim 12 wherein performing the second wet etching process for a duration determined by the measured second thickness includes comparing the measured second thickness with the target thickness.

19. A method for controlling a step height of one or more device isolation regions on a semiconductor device comprising:
performing a chemical mechanical polishing (CMP) on one or more trenches each filled with a dielectric material, wherein the CMP under polishes each of the one or more device isolation regions;
measuring the step height of the one or more device isolation regions;
performing a wet etching process to reduce the measured step height of the one or more device isolation regions and re-measuring the step height of the one or more device isolation regions; and
determining whether the re-measured step height of the one or more device isolation regions meets a target step height, wherein if the re-measured step height of the one or more device isolation regions does not meet the target step height, performing an additional wet etching process for an additional amount of time.

20. The method of claim 19 wherein the one or more device isolation regions comprise shallow trench isolation regions.

21. The method of claim 19 wherein the wet etching process and the additional wet etching process include a hydrofluoric acid dipping process.

22. The method of claim 20, wherein the one or more device isolation regions comprise a single layer.

23. The method of claim 19 further comprising:
providing a substrate having the one or more trenches, wherein a nitrogen-containing layer is disposed over the substrate between each of the one or more trenches;
filling each of the one or more trenches with the dielectric material;
performing the chemical mechanical polishing (CMP) on the one or more filled trenches; and
performing the wet etching process and the additional wet etching process until a top surface of each of the one or more device isolation regions is level with a top surface of the other device isolation regions and the top surface of each of the one or more device isolation regions is level with the nitrogen-containing layer.

* * * * *